(12) United States Patent
Ono (10) Patent No.: US 9,093,340 B2
(45) Date of Patent: Jul. 28, 2015

(54) SOLID-STATE IMAGING APPARATUS WITH PLURAL ANALOG AND DIGITAL CIRCUITS ARRANGED CORRESPONDING TO PLURALITY OF COLUMNAR PIXELS

(71) Applicant: CANON KABUSHIKI KAISHA, Tokyo (JP)

(72) Inventor: Toshiaki Ono, Ebina (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 334 days.

(21) Appl. No.: 13/732,644

(22) Filed: Jan. 2, 2013

(65) Prior Publication Data

US 2013/0181115 A1    Jul. 18, 2013

(30) Foreign Application Priority Data

Jan. 13, 2012    (JP) .................................. 2012-005230

(51) Int. Cl.
| | |
|---|---|
| H01L 27/00 | (2006.01) |
| H01L 27/146 | (2006.01) |
| H01L 27/088 | (2006.01) |
| H04N 5/374 | (2011.01) |

(52) U.S. Cl.
CPC ........ *H01L 27/14601* (2013.01); *H01L 27/088* (2013.01); *H04N 5/3742* (2013.01)

(58) Field of Classification Search
CPC ................................................ H01L 27/14601
USPC ...................................................... 250/208.1
See application file for complete search history.

(56) References Cited

U.S. PATENT DOCUMENTS

| | | | | |
|---|---|---|---|---|
| 6,388,498 | B1 * | 5/2002 | Moriwaki et al. ............ | 327/333 |
| 7,787,037 | B2 | 8/2010 | Ono et al. ..................... | 348/296 |
| 7,817,199 | B2 | 10/2010 | Yamashita et al. ........... | 348/308 |
| 7,986,353 | B2 | 7/2011 | Ono .............................. | 348/241 |
| 8,085,319 | B2 | 12/2011 | Ono et al. ..................... | 348/241 |
| 2005/0156277 | A1 * | 7/2005 | Nakano et al. ................ | 257/532 |
| 2006/0291115 | A1 * | 12/2006 | Song et al. .................... | 361/56 |

(Continued)

FOREIGN PATENT DOCUMENTS

| | | |
|---|---|---|
| JP | 2005-278135 A | 10/2005 |
| JP | 2005-354740 A | 12/2005 |

OTHER PUBLICATIONS

U.S. Appl. No. 13/712,662, filed Dec. 12, 2012.

(Continued)

*Primary Examiner* — Thanh Luu
(74) *Attorney, Agent, or Firm* — Fitzpatrick, Cella, Harper & Scinto (57) ABSTRACT

A solid-state imaging apparatus includes: a read out circuit configured to convert the analog signal generated by a pixel into a digital signal. The read out circuit includes an analog circuit, a digital circuit and a logic circuit arranged between the analog circuit and the digital circuit. The analog circuit is formed within first and second semiconductor regions of first and second conductivity type. The logic circuit is formed within third and fourth semiconductor regions of the first and second conductivity types. The digital circuit is formed within a fifth and sixth semiconductor regions of the first and second conductivity types. The first to sixth semiconductor regions are isolated one from another. And, a number of elements included in the logic circuit is smaller than a number of elements included in the digital circuit.

9 Claims, 5 Drawing Sheets

(56) References Cited

U.S. PATENT DOCUMENTS

2011/0199526 A1   8/2011   Nitta et al. ............... 348/308
2013/0016264 A1   1/2013   Ono ........................ 348/308

OTHER PUBLICATIONS

U.S. Appl. No. 13/741,228, filed Jan. 14, 2013.
U.S. Appl. No. 13/724,891, filed Dec. 21, 2012.

* cited by examiner

SOLID-STATE IMAGING APPARATUS WITH PLURAL ANALOG AND DIGITAL CIRCUITS ARRANGED CORRESPONDING TO PLURALITY OF COLUMNAR PIXELS

BACKGROUND OF THE INVENTION

1. Field of the Invention

The present invention relates to a solid-state imaging apparatus.

2. Description of the Related Art

A solid-state imaging apparatus is known which isolates a power source that supplies an electric power to an analog circuit and a power source that supplies an electric power to a digital circuit from each other, in order to suppress the propagation of a power source noise which is generated in the digital circuit to the analog circuit, when the solid-state imaging apparatus has the analog circuit and the digital circuit mounted together thereon (for instance, Japanese Patent Application Laid-Open No. 2005-354740). In addition, a solid-state imaging apparatus is known which has analog-to-digital-conversion circuits provided in each column (for instance, Japanese Patent Application Laid-Open No. 2005-278135). In a read out circuit, a comparator is the analog circuit, and a counter, a memory and a horizontal transfer circuit are the digital circuits, and accordingly, when the power sources of the analog circuit and the digital circuit are isolated from each other, electric powers are supplied from different power sources to the circuits in both sides of the boundary between the comparator and the counter, respectively.

SUMMARY OF THE INVENTION

However, simply connecting the comparator and the counter to respectively different power sources causes the following problem. When a general binary counter is used as a counter, a flip-flop in the first stage operates at the highest speed, and as the flip-flop goes down to the second stage and the third stage, the operating frequency becomes as slow as ½ and ¼, respectively. In addition, in order to convert an analog signal to a digital signal at a high speed, a clock with a high speed is supplied in the counter, and accordingly a power consumption of the flip-flop in the first stage tends to become large. In addition, the solid-state imaging apparatus is provided with the counters in each column, accordingly the total value of the power consumption of all columns becomes huge, and the power source fluctuation of the counter also becomes larger as the power consumption increases.

Because of this, even when the power sources are isolated from each other, the power source noise of the counter results in being input into the comparator by propagating, for instance, through a path such as signal wiring for connecting the comparator and the counter to each other. The power source fluctuation of the counter propagates to the wiring due to parasitic capacitive coupling, and results in further propagating to the comparator due to coupling between the wiring and the comparator.

When the digital circuit is such a comparatively small circuit as a shift register, as is described in Japanese Patent Application Laid-Open No. 2005-354740, the number of the operating flip-flops is small, and the fluctuation of the power source of the digital circuit is not so large. For this reason, a noise component which propagates by coupling with such wiring may be so small as to be neglected. However, when the circuit has such a large size and operates at such a high speed as an analog-to-digital-conversion circuit described in Japanese Patent Application Laid-Open No. 2005-278135, the fluctuation of the power source becomes a problem.

According to an aspect of the present invention, a solid-state imaging apparatus comprises: a pixel configured to generate an analog signal by a photoelectric conversion; and a read out circuit configured to convert the analog signal generated by the pixel into a digital signal, wherein the read out circuit comprises an analog circuit, a digital circuit and a logic circuit arranged between the analog circuit and the digital circuit, and wherein the analog circuit is formed within a first semiconductor region of a first conductivity type and a second semiconductor region of a second conductivity type, the logic circuit is formed within a third semiconductor region of the first conductivity type and a fourth semiconductor region of the second conductivity type, the digital circuit is formed within a fifth semiconductor region of the first conductivity type and a sixth semiconductor region of the second conductivity type, the first to sixth semiconductor regions are isolated one from another, and the number of elements included in the logic circuit is smaller than the number of elements included in the digital circuit.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

Figure 1:
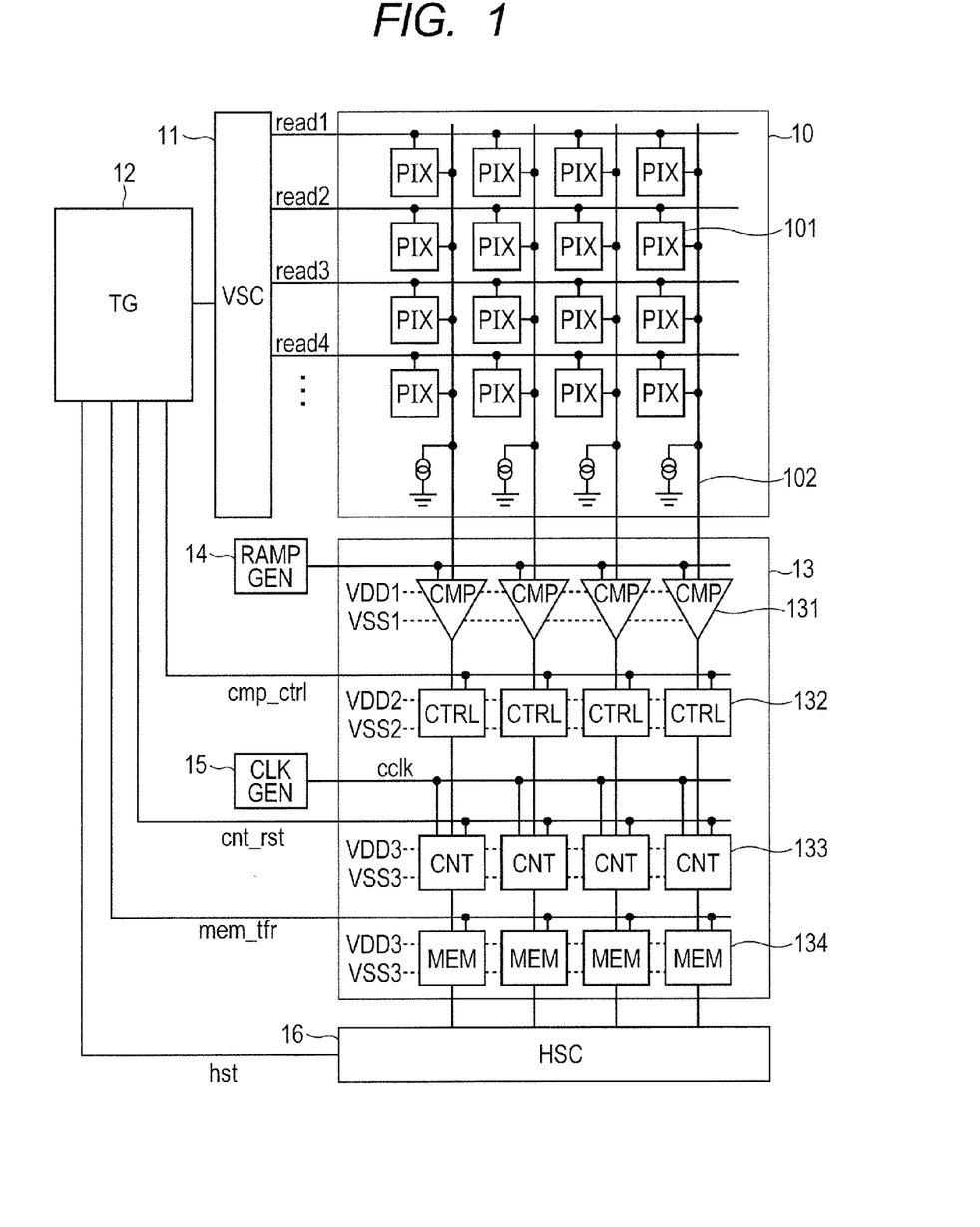
FIG. 1 is a view illustrating a configuration example of a solid-state imaging apparatus.
Figure 2:
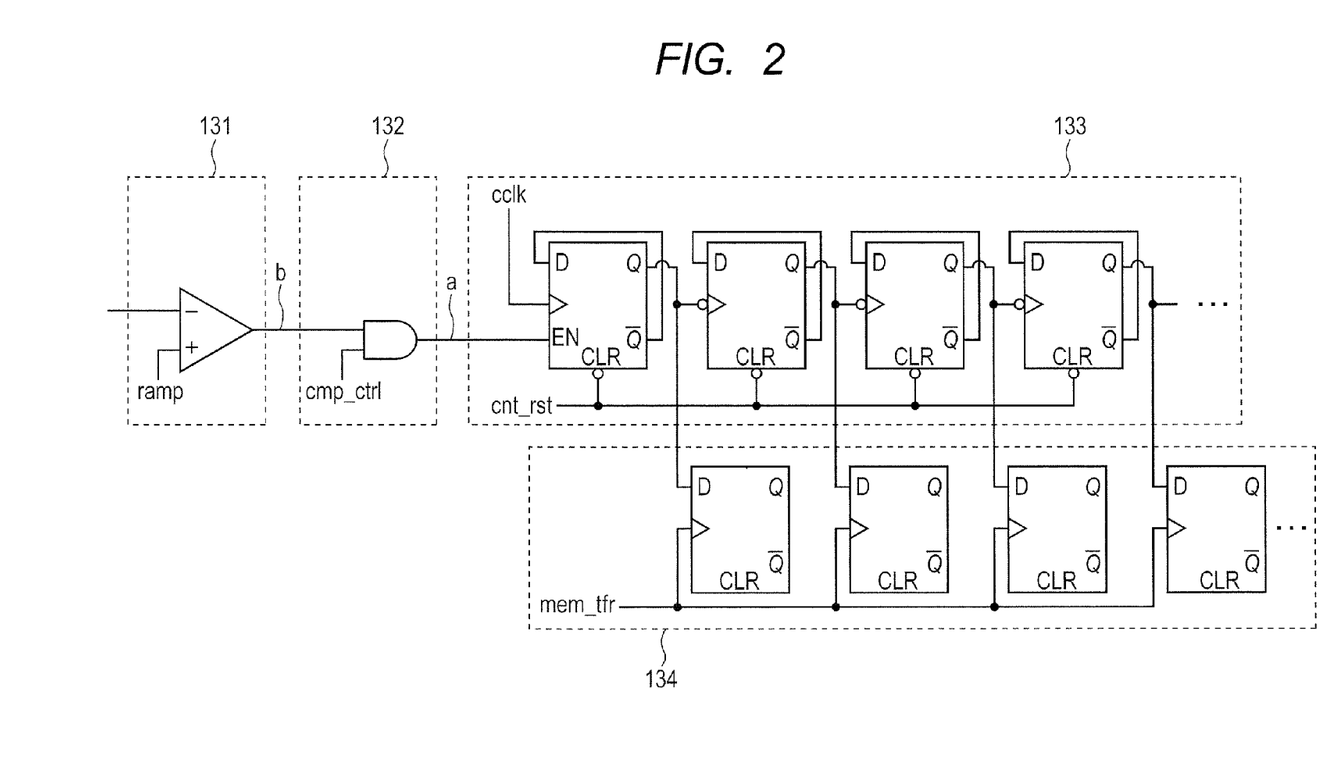
FIG. 2 is a circuit diagram illustrating a configuration example of a read out circuit.

FIG. 1 is a view illustrating a configuration example of a solid-state imaging apparatus according to an embodiment of the present invention; and FIG. 2 is a circuit diagram illustrating a configuration example of a read out circuit 13. Pixels 101 for generating an analog signal by photoelectric conversion are two-dimensionally arrayed in a pixel section 10. The signal of the pixel 101 which has been selected by a vertical scanning circuit 11 is output to a vertical output line 102. A read out circuit 13 has a comparator 131, a control circuit 132, a counter 133 and a memory 134, and converts the analog signal which has been generated by the pixel 101 to a digital signal. A timing generator 12 outputs a signal cmp_ctrl, a signal cnt_rst, an mem_tfr pulse and an signal hst. The comparator 131 compares the signal of the vertical output line 102 with a ramp signal ramp sent from a ramp generator 14. When the relationship between the magnitudes of the potentials of both signals is reversed, the output level of the comparator 131 is inverted. The ramp signal ramp is a signal of which the level increases gradually along with the elapse of time like a triangular wave, for instance. The control circuit (logic circuit) 132 has a conjunction (AND) circuit, and outputs a conjunction signal of the signal cmp_ctrl sent from the timing generator 12 and the output signal of the comparator 131, to the counter 133. The control circuit 132 is provided between the comparator (analog circuit) 131 and the counter (digital circuit) 133. If the timing generator 12 maintains the signal cmp_ctrl at a high level during the reading operation, the output signal of the comparator 131 is input into the counter 133. The count clock generator 15 outputs a clock signal cclk. The counter 133 has a plurality of D-type flip-flops, up-counts the value based on the clock signal cclk, and if the signal cmp_ctrl is maintained at a high level, stops up-counting of the value when the output signal of the comparator 131 is inverted. Thereby, the count value of the counter 133 in each column becomes a value proportional to a period spent by the time when the output signal of the comparator 131 is inverted, in other words, a value proportional to the output signal of the pixel 101. The memory 134 has a plurality of D-type flip-flops, takes in a count value which is held by the counter 133 when an mem_tfr pulse of a high level is input, and stores the count value therein. A horizontal transfer circuit 16 sequentially scans the values stored in each memory 134 when an signal hst of a high level is input, and outputs the digital signals to the outside. Thereby, the analog signal of the pixel 101 can be converted to the digital signal. The counter 133 is reset to an initial value when the signal cnt_rst is input, and shifts the analog-to-digital-conversion operation to the next row. If the signal cmp_ctrl is maintained at a low level except the period of the reading operation, the input of the counter 133 can be maintained at a low level regardless of the output signal of the comparator 131, and accordingly an unnecessary through current can be prevented. Here, a power source potential and a ground potential of the comparator 131 are held at potentials VDD1 and VSS1, respectively. In addition, a power source potential and a ground potential of the control circuit 132 are held at VDD2 and VSS2 which are different potentials, respectively. In addition, a power source potential and a ground potential of the counter 133 and the memory 134 are VDD3 and VSS3 which are further different potentials, respectively.

Figure 3:
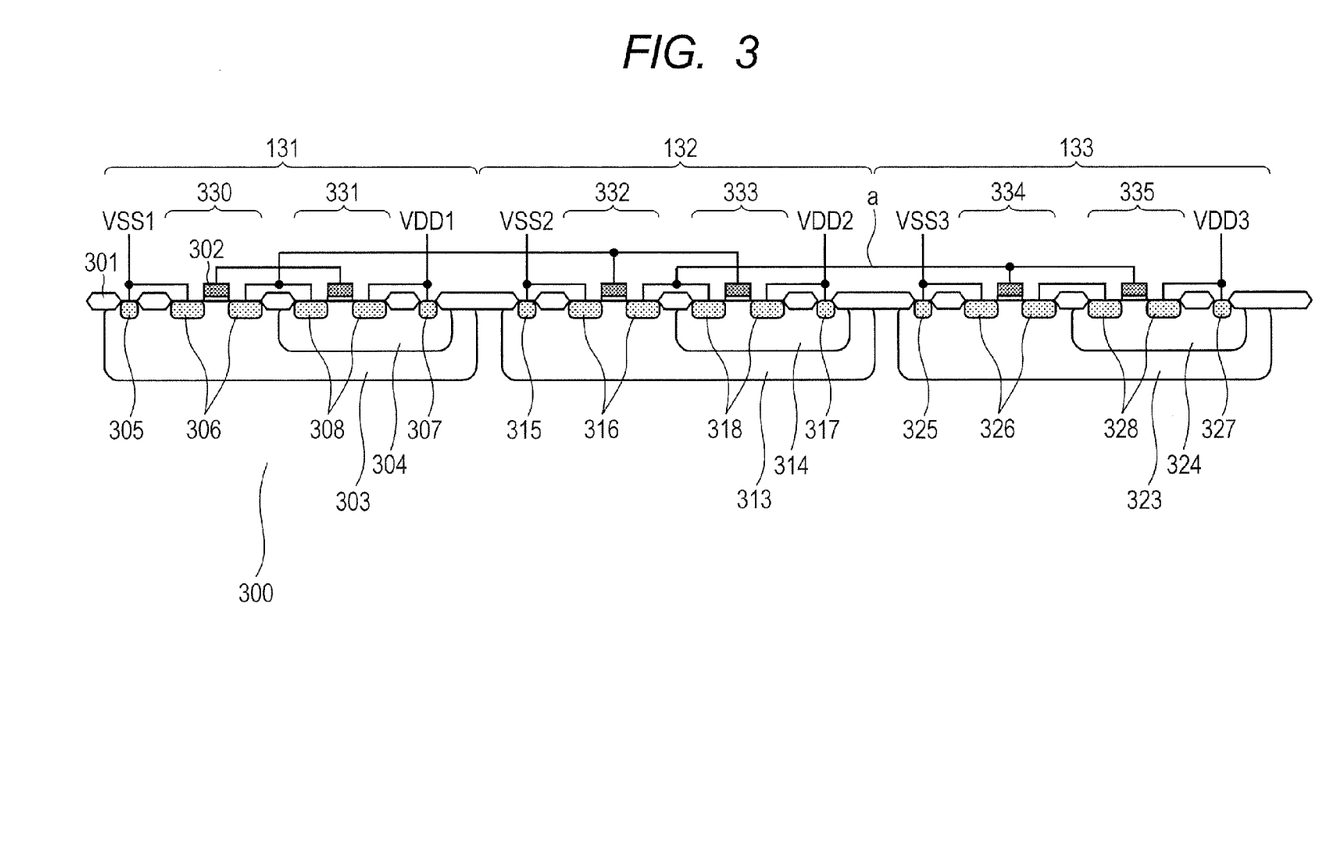
FIG. 3 is a sectional view of the read out circuit.

FIG. 3 is a view illustrating a configuration example of a cross section of one part of the read out circuit 13. An N-type substrate 300 has element isolation regions 301 formed thereon, and P-type wells 303, 313 and 323 formed so as to be isolated from each other, respectively. In the P-type wells 303, 313 and 323, N-type wells 304, 314 and 324 are formed so as to be isolated from each other, respectively. Accordingly, the wells 303, 313, 323, 304, 314 and 324 are isolated from each other, respectively.

The comparator (analog circuit) 131 has an NMOS transistor 330 and a PMOS transistor 331. The NMOS transistor 330 is formed in the first P-type well 303 (in first semiconductor region of first conductivity type), and has a gate electrode 302 and an N-type diffusion region 306. The PMOS transistor 331 is formed in the first N-type well 304 (in second semiconductor region of second conductivity type), and has the gate electrode 302 and a P-type diffusion region 308. The first P-type well 303 is connected to the first ground potential VSS1 through a P-type diffusion layer 305, and the first N-type well 304 is connected to the first power source potential VDD1 through an N-type diffusion layer 307.

The control circuit (logic circuit) 132 has an NMOS transistor 332 and a PMOS transistor 333. The NMOS transistor 332 is formed in the second P-type well 313 (in third semiconductor region of first conductivity type), and has the gate electrode 302 and an N-type diffusion region 316. The PMOS transistor 333 is formed in the second N-type well 314 (in fourth semiconductor region of second conductivity type), and has the gate electrode 302 and a P-type diffusion region 318. The second P-type well 313 is connected to the second ground potential VSS2 through a P-type diffusion layer 315, and the second N-type well 314 is connected to the second power source potential VDD2 through an N-type diffusion layer 317.

The counter (digital circuit) 133 has an NMOS transistor 334 and a PMOS transistor 335. The NMOS transistor 334 is formed in the third P-type well 323 (in fifth semiconductor region of first conductivity type), and has the gate electrode 302 and an N-type diffusion region 326. The PMOS transistor 335 is formed in the third N-type well 324 (in sixth semiconductor region of second conductivity type), and has the gate electrode 302 and a P-type diffusion region 328. The third P-type well 323 is connected to the third ground potential VSS3 through a P-type diffusion layer 325, and the third N-type well 324 is connected to the third power source potential VDD3 through an N-type diffusion layer 327. The first to sixth semiconductor regions 303, 304, 313, 314, 323 and 324 are isolated from each other, respectively.

Figure 4:
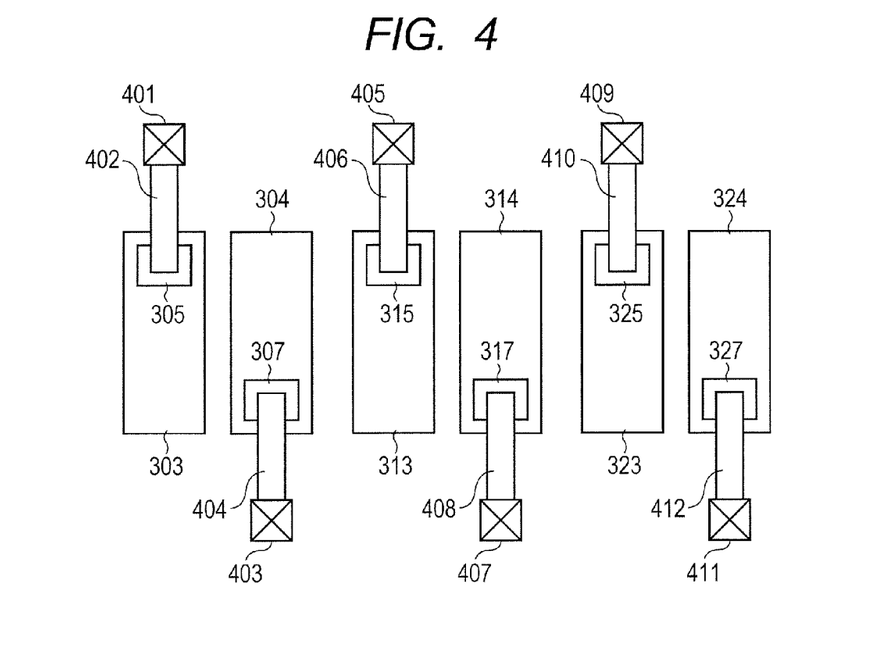
FIG. 4 is a plan view of the read out circuit.

FIG. 4 is a plan view illustrating one part of the read out circuit 13, and illustrates such a structure as to prevent the influence of the noise. The first P-type well 303 is connected to a first external input pad 401 through the P-type diffusion layer 305 and a first metal wiring (first wiring) 402, and the first external input pad 401 is connected to an external ground line. The first N-type well 304 is connected to a fourth external input pad 403 through the N-type diffusion layer 307 and a fourth metal wiring (fourth wiring) 404, and the power source potential is supplied to the fourth external input pad 403 by an external power source of low impedance. The second P-type well 313 is connected to a second external input pad 405 through the P-type diffusion layer 315 and a second metal wiring (second wiring) 406, and the second external input pad 405 is connected to the external ground line. The second N-type well 314 is connected to a fifth external input pad 407 through the N-type diffusion layer 317 and a fifth metal wiring (fifth wiring) 408, and the power source potential is supplied to the fifth external input pad 407 by the external power source of low impedance. The third P-type well 323 is connected to a third external input pad 409 through the P-type diffusion layer 325 and a third metal wiring (third wiring) 410, and the third external input pad 409 is connected to the external ground line. The third N-type well 324 is connected to a sixth external input pad 411 through the N-type diffusion layer 327 and a sixth metal wiring (sixth wiring) 412, and the power source potential is supplied to the sixth external input pad 411 by the external power source of low impedance.

In this way, the first to third metal wirings (first to third wirings) 402, 406 and 410 are isolated from each other, and the first to third external input pads 401, 405 and 409 are also isolated from each other. The respective P-type wells 303, 313 and 323 are connected to the external ground line by the metal wirings 402, 406 and 410 which have low resistance and are independent from each other and by the external input pads 401, 405 and 409 which are independent from each other; and thereby do not interfere with each other. In addition, the fourth to sixth metal wirings (fourth to sixth wirings) 404, 408 and 412 are isolated from each other, and the fourth to sixth external input pads 403, 407 and 411 are also isolated from each other. The respective N-type wells 304, 314 and 324 are connected to the external ground line by the metal wirings 404, 408 and 412 which have low resistance and are independent from each other and by the external input pads 403, 407 and 411 which are independent from each other; and thereby do not interfere with each other.

Figure 5:
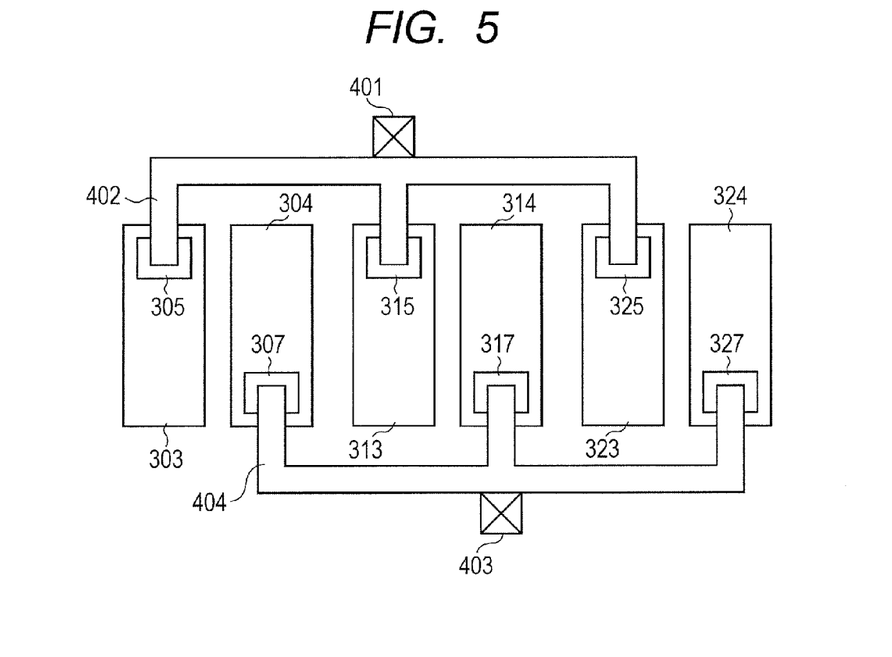
FIG. 5 is a plan view illustrating another example of the read out circuit.

In addition, as is illustrated in FIG. 5, the external input pad 401 may be connected to each of the P-type wells 303, 313 and 323 as a common input pad through the metal wiring 402 which has low resistance and is branched on the way; and the external input pad 403 may be connected to each of the N-type wells 304, 314 and 324 as a common input pad through the metal wiring 404 which has low resistance and is separated on the way. In this case as well, a similar effect is obtained.

Here, when the circuit of the counter 133 is a binary counter as illustrated in FIG. 2, the counter 133 has a plurality of stages of D-type flip-flops. The D-type flip-flop in the first stage operates at the highest frequency, and operates at the same frequency as that of the clock signal cclk. The D-type flip-flop in the second stage operates at ½ of the frequency of the clock signal cclk and the D-type flip-flop in the third stage operates at ¼ of the frequency of the clock signal cclk. In this manner, the frequency sequentially decreases to ½ of the frequency of a previous stage. For this reason, the power source fluctuation of the D-type flip-flop in the first stage becomes the largest, and the power source fluctuation noise propagates to the control circuit 132 through wiring a by capacitive coupling. However, the control circuit 132 is an AND circuit, and is not an analog circuit but a logic circuit (digital circuit); and accordingly is resistant to the noise. Because of this, even when the power source fluctuation noise comes into the control circuit 132 through the wiring a, the power source fluctuation noise does not cause an operational problem.

In addition, the control circuit 132 is formed of such few circuit elements as one AND circuit, and accordingly does not almost generate the power source fluctuation even when the control circuit 132 operates. Therefore, the control circuit 132 does not almost generate a noise though the control circuit 132 is connected with the comparator 131 by wiring b, and accordingly the noise does not intrude into the comparator 131 which is the analog circuit.

As has been described above, the control circuit 132 is inserted between the counter 133 and the comparator 131, the P-type wells and the N-type wells in each circuit are isolated from each other, and metal wirings for supplying the power source potentials and the ground potentials are also isolated. Thereby, the control circuit 132 can prevent the noise which has been generated in the counter 133 from intruding into the comparator 131. Here, the control circuit 132 is required to be a circuit resistant to the intrusion of the noise from the counter 133, and not to generate the noise toward the comparator 131, as necessary requirements. It is desirable from the former requirement that the control circuit 132 is a logic circuit which operates in digital form. It is desirable from the latter requirement that the number of elements in the control circuit (logic circuit) 132 is smaller than the number of elements in the counter (digital circuit) 133. Thereby, the control circuit 132 can suppress the propagation of the power source noise of the counter (digital circuit) 133 to the comparator (analog circuit) 131.

Figure 6A:
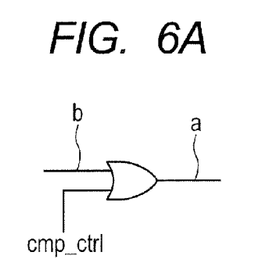
FIGS. 6A, 6B, 6C, 6D, 6E, 6F, 6G and 6H are views illustrating a configuration example of a control circuit.
Figure 6B:
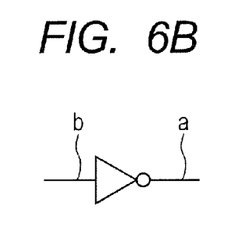
Figure 6C:
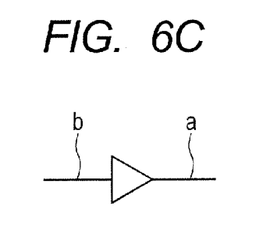
Figure 6D:
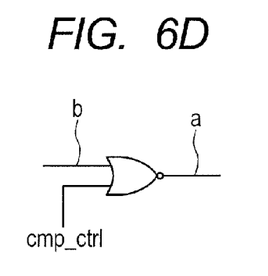
Figure 6E:
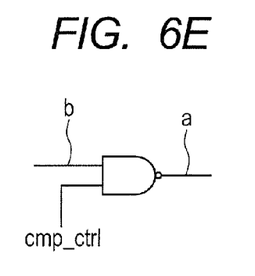
Figure 6F:
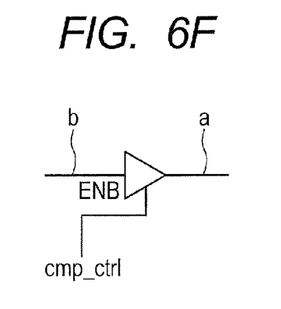
Figure 6G:
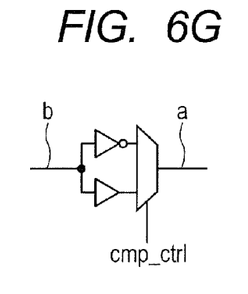
Figure 6H:
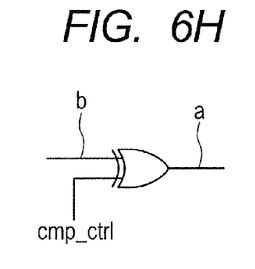

In the present embodiment, the AND circuit is used as an example of the control circuit 132, but may be any circuit as long as the circuit satisfies the above described two requirements. For instance, a disjunction (OR) circuit as illustrated in FIG. 6A may be used. In addition, an inverter circuit as illustrated in FIG. 6B may be used. A buffer circuit as illustrated in FIG. 6C also may be used. A non-disjunction (NOR) circuit as illustrated in FIG. 6D also may be used. A non-conjunction (NAND) circuit as illustrated in FIG. 6E also may be used. A tri-state buffer circuit as illustrated in FIG. 6F also may be used. In addition, a selector circuit as illustrated in FIG. 6G also may be used. An exclusive disjunction (EXOR) circuit as illustrated in FIG. 6H also may be used. As long as the circuit is a logic circuit such as the circuits in FIGS. 6A to 6H and the number of elements is few, the same effect can be obtained even when any circuit has been used. In addition, these circuits may be used in combination with the other circuits.

Note that the above embodiments are merely examples how the present invention can be practiced, and the technical scope of the present invention should not be restrictedly interpreted to the embodiments. In other words, the present invention can be practiced in various ways without departing from the technical concept and main features of the invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-005230, filed Jan. 13, 2012, which is hereby incorporated by reference herein in its entirety.

What is claimed is:

1. A solid-state imaging apparatus comprising:
a pixel unit including a plurality of pixels arranged in a matrix and configured to generate an analog signal by a photoelectric conversion; and
a read out circuit configured to convert the analog signal generated by the pixel unit into a digital signal, wherein the read out circuit comprises
a plurality of analog circuits arranged each correspondingly to each of the plurality of pixels arranged in a column direction,
a plurality of digital circuits arranged each correspondingly to each of the plurality of pixels arranged in a column direction and
a plurality of logic circuits arranged each correspondingly to each of the plurality of pixels arranged in a column direction, and arranged between the plurality of analog circuits and the plurality of digital circuits, and wherein
the plurality analog circuits are formed within a first semiconductor region of a first conductivity type and a second semiconductor region of a second conductivity type,
the plurality of logic circuits are formed within a third semiconductor region of the first conductivity type and a fourth semiconductor region of the second conductivity type,
the plurality of digital circuits are formed within a fifth semiconductor region of the first conductivity type and a sixth semiconductor region of the second conductivity type,
the first to sixth semiconductor regions are electrically isolated from one another, and
the number of elements included in each of the plurality of logic circuits is smaller than the number of elements included in each of the plurality of digital circuits.

2. The solid-state imaging apparatus according to claim 1, further comprising
a first wiring connected to the first semiconductor region, a second wiring connected to the third semiconductor region, and a third wiring connected to the fifth semiconductor region, wherein
the first to third wirings are isolated from one another.

3. The solid-state imaging apparatus according to claim 2, further comprising
a first external input pad connected to the first wiring, a second external input pad connected to the second wiring and a third external input pad connected to the third wiring, wherein the first to third external input pads are isolated from one another.

4. The solid-state imaging apparatus according to claim 1, further comprising
a fourth wiring connected to the second semiconductor region, a fifth wiring connected to the fourth semiconductor region, and a sixth wiring connected to the sixth semiconductor region, wherein
the fourth to sixth wirings are isolated from one another.

5. The solid-state imaging apparatus according to claim 4, further comprising
a fourth external input pad connected to the fourth wiring, a fifth external input pad connected to the fifth wiring and a sixth external input pad connected to the sixth wiring, wherein
the fourth to sixth external input pads are isolated from one another.

6. The solid-state imaging apparatus according to claim 1, wherein the plurality of logic circuits perform a digital operation.

7. The solid-state imaging apparatus according to claim 1, wherein the plurality of digital circuits have a plurality of counters.

8. The solid-state imaging apparatus according to claim 7, wherein the number of elements included in each of the plurality of logic circuits is smaller than the number of elements included in each of the plurality of counters.

9. The solid-state imaging apparatus according to claim 7, wherein the plurality of analog circuits have a plurality of comparator, and the plurality of logic circuits are arranged between the plurality of comparator and the plurality of counters.

\* \* \* \* \*